United States Patent

Zielinski

[11] 3,985,597
[45] Oct. 12, 1976

[54] PROCESS FOR FORMING PASSIVATED METAL INTERCONNECTION SYSTEM WITH A PLANAR SURFACE

[75] Inventor: Laura B. Zielinski, Plantsville, Conn.

[73] Assignee: International Business Machines Corporation, Armonk, N.Y.

[22] Filed: May 1, 1975

[21] Appl. No.: 573,678

[52] U.S. Cl. .................... 156/11; 96/36.2; 156/2; 156/13; 156/17; 204/192; 427/90; 427/91; 427/264
[51] Int. Cl.² ............... H01L 21/312; H01L 21/443
[58] Field of Search ............. 156/2, 3, 11, 17, 13; 96/36.2; 427/90, 91, 96, 99, 264, 270; 204/192

[56] References Cited
UNITED STATES PATENTS

| | | | |
|---|---|---|---|
| 3,498,833 | 3/1970 | Lehrer | 427/91 |
| 3,700,497 | 10/1972 | Epifano et al. | 427/90 |
| 3,791,858 | 2/1974 | McPherson et al. | 156/3 |
| 3,799,777 | 3/1974 | O'Keefe et al. | 96/36.2 |
| 3,849,136 | 11/1974 | Grebe | 96/36.2 |

*Primary Examiner*—William A. Powell
*Assistant Examiner*—Jerome W. Massie
*Attorney, Agent, or Firm*—Wolmar J. Stoffel

[57] ABSTRACT

A process for forming an embedded interconnection metallurgy system on a substrate by (1) forming a first layer of an organic thermosetting polymerized resin material on the substrate, (2) forming a second overlying layer of a material that is soluble in a solvent that does not appreciably affect the material of the first layer, (3) forming a third layer resistant to reactive ion etching in $O_2$ on the second layer, (4) masking the third layer to define the pattern of the desired metallurgy, (5) removing the exposed areas of the third layer, (6) reactive ion etching the resultant exposed areas of the first and second layers, (7) depositing a conductive metal with a thickness approximately matching the thickness of the first layer, and (8) exposing the substrate to a solvent selective to the material of the second layer thereby removing it and the overlying portions of the conductive metal layer.

14 Claims, 8 Drawing Figures

PROCESS FOR FORMING PASSIVATED METAL INTERCONNECTION SYSTEM WITH A PLANAR SURFACE

BACKGROUND OF THE INVENTION

1. Field of the Invention

This invention relates to a process for forming embedded metallurgy patterns on a substrate, more particularly to a process for forming an interconnection metallurgy system embedded in the passivating layer with a planar top surface.

2. Description of the Prior Art

The forming of an interconnection metallurgy system for integrated circuit devices has conventionally been done by blanket depositing a metal layer, forming a photoresist layer on the metal layer, exposing the resist to the desired metallurgy pattern, developing the resist, and subsequently etching the exposed portions of the underlying metal layer to thereby form the interconnection metallurgy system. The pattern was subsequently covered by an insulating layer and another metallurgy pattern formed over same, making contact to the underlying layer through via holes, until the desired interconnection metallurgy system was complete. However, with continued miniaturization of semiconductor integrated circuits to achieve greater component density particularly in large scale integrated circuitry, the metallurgy was made smaller and more dense. The planarity of the surface of the system became a serious consideration in the fabrication of interconnection systems. Each time a metallurgy pattern is deposited on a surface, the more irregular or non-planar the surface of the overlying insulating layer becomes. In general, after three levels of metallurgy have been deposited, the surface becomes so irregular that additional layers cannot be deposited. The irregular surface presents two very important problems which have a direct bearing on the yield and reliability of the resultant system. When a layer of metal is deposited over an irregular surface, the resultant layer becomes thinner over a step portion of the supporting layer. This thinned down portion results in current crowding and possible failure due to electromigration. A further problem is concerned with forming the resist pattern. Clear, distinct exposure becomes impossible as the surface becomes more irregular.

With subtractive etching of the blanket layer of metal, the sidewalls of the resultant stripe are sloping because the etchant works downwardly as well as inwardly. This reduces the cross-section of the resultant stripe, limiting its current carrying capacity. A technique which was developed to overcome this problem was termed "expendable mask method" or "lift-off method" which was initially described and claimed in U.S. Pat. No. 2,559,389. Improvements to the basic lift-off method have been made, as for example in commonly assigned U.S. Pat. Nos. 3,849,136 filed Aug. 31, 1973 and 3,873,361 filed Nov. 29, 1973. However, the lift-off technique for forming a metallurgy system does not overcome the non-planarity problem discussed previously.

SUMMARY OF THE INVENTION

It is a primary object of this invention to provide an improved method for forming passivated metal interconnection systems having a surface planarity.

It is another object of this invention to provide an improved lift-off method for forming metal interconnection systems for integrated circuit devices.

In accordance with the objects of this invention, the process for forming an embedded interconnection metallurgy system on a substrate, involves forming a first layer of an organic thermosetting polymerized resin material on the substrate, forming a second overlying layer of a material that is soluble in a solvent that does not appreciably affect the material of the first layer, forming a third thin layer resistant to reactive ion etching in $O_2$ on the second layer, depositing a resist layer, exposing the resist to form an inverse pattern of the desired metallurgy pattern and developing the resist, removing the resultant exposed areas of the third layer, reactive ion etching the resultant exposed areas of the first and second layers, depositing a conductive metal layer having a thickness approximately matching the thickness of the first layer, and exposing the substrate to a solvent that is selective to the material of the second layer.

BRIEF DESCRIPTION OF THE DRAWINGS

The foregoing and other objects, features and advantages of the invention will be apparent from the following more particular description of preferred embodiments of the invention as illustrated in the accompanying drawings.

DESCRIPTION OF THE PREFERRED EMBODIMENTS

Figure 1:
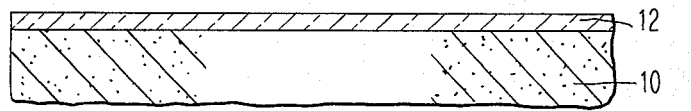
FIGS. 1 through 6 is a sequence of elevational views in broken section illustrating a substrate at various stages during the practice of the method of the invention.

Referring now to the drawings and in FIG. 1 in particular, there is disclosed a substrate 10 which is typically monocrystalline silicon or other semiconductor material with an overlying layer 12 of a dielectric layer, as for example $SiO_2$. The substrate 10 in the preferred embodiment of the process of the invention is an integrated circuit device having active and passive devices fabricated therein (not shown) and means for electrically isolating the devices from each other. In this application, layer 12 is provided with contact openings (not shown) for making contact to the active and passive devices. The substrate could also be a body of insulating material when the process is used to form metallurgy on a module for supporting integrated circuit devices and appropriate associated circuitry.

Figure 2:
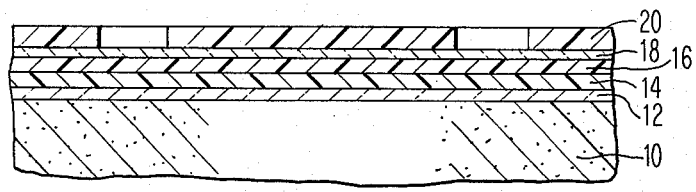

As illustrated in FIG. 2, a first layer 14 of an organic thermosetting polymerized resin material is formed on substrate 10. The material of layer 14 can be of any suitable material that will adhere to layer 12. If necessary or desirable, the surface of layer 12 can be treated to insure adhesion of layer 14. A preferred material for layer 14 is a polyimide plastic material. An example of such a material is commercially available sold under the trademark of P13N by Ciba-Geigy of Ardsley, N.Y.

The polyimide is formed by reacting pyrometallic dianhydride with an aromatic diamine which yields a polyamic acid. The polyamic acid is dehydrated in situ. A preferred technique for forming layer 14 is by depositing the material in liquid form on a substrate and then spinning. The spinning action flows the material over the surface of the wafer to a relatively uniform thickness. The material is subsequently heated to dehydrate or cure the material. With the preferred polyimide material, the curing can be accomplished by heating 20 minutes at 80° C which removes the solvent from the material. A second heating for ten minutes at 200° C causes imidization. A third heating step for 20 minutes at 310° C causes the material to cross-link. Other suitable materials can be utilized. In general, the material to be used should have a high temperature stability of over 400° C and have a suitable viscosity such that it will flow during the deposition and to a small extent during the curing cycle. The thickness of layer 14 is controlled by the viscosity of the material deposited on the wafer and the rate at which it is spun during the deposition. Typically, the thickness is in the range of one to five microns, more preferably from 1 to 2 microns when used in integrated circuit interconnection metallurgy applications. A second layer 16, also preferably of an organic polymerized resin material, such as polysulfones, polycarbinates, etc., is deposited on layer 14 as shown in FIG. 2. The material of layer 16 is chosen such that it is soluble in a solvent that does not appreciably affect the material of layer 14. A preferred material for layer 16 is a polysulfone polymerized resin formed by reacting sulphur dioxide with aromatic or aliphatic vinyl compounds. A typical polysulfone resin is sold under the trademark "ASTREL 360" by 3M Company, Minneapolis, Minnesota. The polysulfone resin is available as a relatively viscous liquid which can be deposited on a wafer and then spun at an rpm in the range of 4000 rpm. Preferably, the polysulfone material, which is in a solution of n-methyl pyrrolidone, is deposited and spun at a low humidity or an $N_2$ atmosphere. The material is subsequently cured by heating for five minutes at 80° C, subsequently heating for 10 minutes at 200° C, and finally for 20 minutes at 310° C. The thickness of layer 16 is typically in the range of 0.5 to 2.5 microns, more preferably in the range of 0.5 to 1.0 microns in integrated circuit applications. A relatively thin masking layer 18 is subsequently deposited on layer 16. Layer 18 can be of any suitable material that is resistant to reactive ion etching in $O_2$ as will become more apparent in the description that follows. Layer 18 can be a layer of $SiO_2$, $Al_2O_3$, Si, $Si_3N_4$, or a metal layer. A preferred material for layer 18 is a glass resin which is predominantly a polymethylsiloxane material formed by spinning on a one percent solution of a glass resin polymer sold by Owens Illinois under the designation "type 650". The materials spun on are then heated for fifteen minutes at 210° C to cause curing. However, any suitable type of glass or inorganic material that is resistant to reactive ion etching, particularly in an $O_2$ ambient or an ambient that contains $O_2$ can be used. A layer 20 of a photoresist is then deposited on the surface of layer 18, exposed to form the inverse of the desired metallurgy pattern, and developed as shown in FIG. 2. The resist material of layer 20, its exposure and development is in accordance with known technology.

Figure 3:
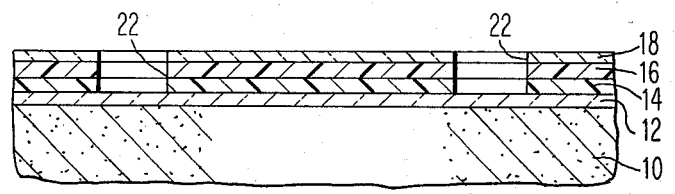

As shown in FIG. 3, the exposed portions of layers 14, 16 and 18 are then removed forming straight, vertical walls. The exposed portions of layer 18 can be removed by any suitable technique, as for example dip etching or the like in a suitable solvent. A preferred technique for removing the material of the three layers is by reactive ion etching. In reactive ion etching, the substrate is exposed to a reactive ion plasma generated in an appropriate ambient by an RF power source. Preferred apparatus for performing the operation is illustrated and claimed in U.S. Pat. No. 3,598,710. In removing the material of layer 18 when the material is a glass resin, the ambient at least includes $CF_4$. More preferably, the removal of the exposed portions of layer 18 is achieved by an ambient consisting of $CF_4$ at a pressure of 50 millitorr and a power density of 0.3 watts/cm². The layer 18 is etched away in a few minutes. Subsequently, the ambient in the sputter apparatus is changed to an $O_2$ ambient and the exposed portions of layers 14 and 16 are removed as shown in FIG. 3. Preferably, the etching is accomplished at a pressure of 50 millitorr of $O_2$ at a power density of 0.1 watts/cm². Alternately, the ambient could consist of $O_2$ in combination with argon or nitrogen. As indicated in FIG. 3, the sidewalls of the openings 22 are substantially vertical.

Figure 4:
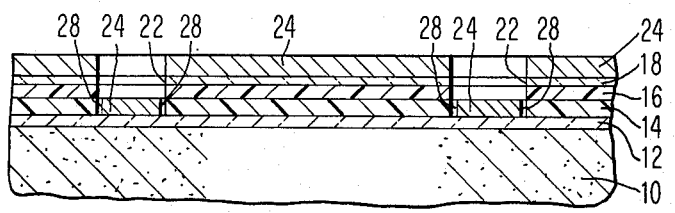

As shown in FIG. 4, a metallic layer 24 is deposited on the resultant surface of the substrate 10 resulting in a layer on the top surface of layer 18 and also portions in openings 22 resting on layer 12. The thickness of layer 24 should be approximately the same thickness of layer 14. Layer 24 of conductive material can be of any suitable type of material such as aluminum, molybdenum, tantalum, or laminated combinations such as chromium-silver-chromium, molybdenum-gold-molybdenum, chromium-copper-chromium, and the like.

Figure 5:
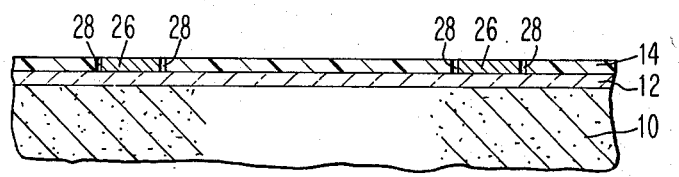

As shown in FIG. 5, layer 16 and all of the overlying layers are then removed by exposing the substrate to a solvent for the material of layer 16. When the preferred material of layer 16 is used, i.e. polysulfone plastic, as described previously, the solvent is n-methyl pyrrolidone at room temperature. The bath is preferably agitated by an ultrasonic device to hasten removal of the layers. Any suitable solvent can be used subject to the condition that it is selective to the material of layer 16 and does not appreciably affect the material selected for layer 14. The resultant structure is illustrated in FIG. 5 wherein a metallurgy pattern 26 is surrounded by layer 14 and wherein the surface presented by the pattern and layer is substantially coplanar. Note that small spaces 28 exist between the pattern 26 and layer 14. These, however, are filled in when the second sequence of steps is used to form the next layer and metallurgy pattern.

Figure 6:
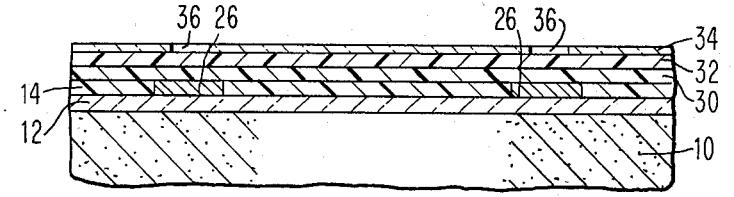

As shown in FIG. 6, the structure shown in FIG. 5 is covered with an organic thermosetting polymerized resin layer 30 similar to the material of layer 14 and formed thereon in the same manner previously described. Layer 32 corresponds to layer 16 and layer 34 to layer 18. The pattern 36 shown formed in layer 34 is typically the via hole pattern for forming the connection between the lower metallurgy pattern 26 and the pattern to be formed. When layer 30 is deposited, the openings 28 are filled in by the material as it is spun on the surface.

Figure 7:
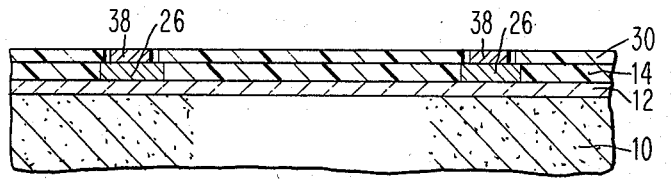
FIG. 7 is an elevational view in broken section illustrating the substrate with an additional insulating and metal layer constituting the via opening and conductive portions therein resulting from repeating the same sequence of steps illustrated in FIGS. 1–6.

In FIG. 7, there is illustrated the structure after the second sequence of method steps, i.e. as illustrated in FIGS. 1–5, which are used to form the via openings in layer 30 and the via metallurgy pattern 38.

Figure 8:
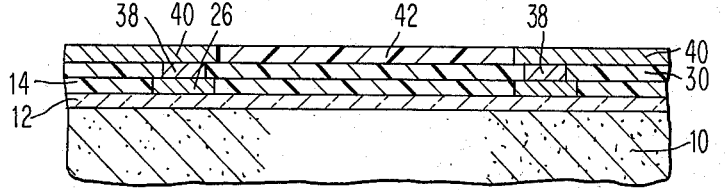
FIG. 8 is an elevational view in broken section illustrating the structure with an additional metallurgy layer formed in accordance with the method of the invention by repeating the steps illustrated in FIGS. 1–6.

FIG. 8 illustrates the end structure after another sequence of steps, i.e. as illustrated in FIGS. 1–5, is performed to form the second metallurgy layer of an interconnection pattern 40 and the intervening insulating layer 42. As will be apparent to the skilled in the art, any desired number of interconnection layers can be formed by repeating the method steps illustrated in FIGS. 1–5. As the layers are built up, the surface of the interconnection pattern and the insulating material surrounding same is substantially planar. This permits the number to be increased beyond the number that can be built up using present known technologies.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A process for forming an embedded interconnection metallurgy system on a substrate comprising:

forming a first layer of an organic thermosetting polymerized resin material on the top surface of said substrate;

forming a second overlying layer of a second organic polymerized resin material that is soluble in a solvent that does not appreciably affect the material of said first layer;

forming a third thin layer resistant to reactive ion etching in $O_2$ on said second layer, depositing a resist layer over said third layer, exposing the resist to form an inverse pattern of the desired metallurgy pattern and developing the resist;

removing the resultant exposed areas of said third layer;

reactive ion etching the resultant exposed areas for a time sufficient to completely remove the exposed portions of said first and second layers;

depositing over said third layer and exposed areas of said substrate a blanket conductive metal layer having a thickness approximately matching the thickness of said first layer; and exposing said substrate to a solvent that is selective to the material of said second layer for a time sufficient to remove said second layer and overlying portions of said conductive metal layer.

2. The process of claim 1 wherein multiple interconnection metallurgy levels are formed by repeating the sequence of process steps.

3. The process of claim 1 wherein the material of said first layer is a polyimide formed by reacting pyromellitic dianhydride with an aromatic diamine to yield a polyamic acid, and dehydrating said acid.

4. The process of claim 3 wherein the material of said second layer is polysulfone formed by reacting sulphur dioxide with aromatic or aliphatic vinyl compounds.

5. The process of claim 3 wherein said first layer is formed by spinning on said polyimide material and subsequently heating at elevated temperatures.

6. The process of claim 4 wherein said second layer is formed by spinning on said polysulfone material and subsequently heating at elevated temperatures.

7. The process of claim 4 wherein said third layer is a glass resin polymer comprised predominantly of polymethylsiloxane.

8. The process of claim 1 wherein said conductive metal layer is aluminum that is vapor deposited.

9. The process of claim 4 wherein said solvent is n-methyl pyrrolidone and said second layer and the overlying layers are removed in an ultra-sonic bath.

10. The process of claim 1 wherein said exposed areas of third layer are removed by reactively ion etching in an ambient that at least includes $CF_4$.

11. The process of claim 1 wherein said reactive ion etching of said first and second layers is accomplished in an ambient that at least includes $O_2$.

12. The process of claim 10 wherein said reactive ion etching ambient for removing areas of said third layer is a mixture of an inert gas and $CF_4$.

13. The process of claim 11 wherein said reactive ion etching ambient for removing said first and second layers is a mixture of an inert gas and $O_2$.

14. The process of claim 1 wherein said substrate is an integrated circuit semiconductor device having active and passive devices, and an overlying insulating layer with contact openings to said devices.

* * * * *